(12) United States Patent
Chen

(10) Patent No.: US 7,120,026 B2
(45) Date of Patent: Oct. 10, 2006

(54) HEAT-DISSIPATING DEVICE WITH HEAT CONDUCTIVE TUBES

(76) Inventor: Shyh-Ming Chen, 235 Chung - Ho Box 8-24, Taipei (TW)

( * ) Notice: Subject to any disclaimer, the term of this patent is extended or adjusted under 35 U.S.C. 154(b) by 71 days.

(21) Appl. No.: 10/958,878

(22) Filed: Oct. 6, 2004

(65) Prior Publication Data

US 2006/0072290 A1   Apr. 6, 2006

(51) Int. Cl.
*H05K 7/20* (2006.01)
(52) U.S. Cl. .................... 361/704; 361/697; 361/701; 165/80.3; 165/185; 29/890.043; 29/890.047
(58) Field of Classification Search ........ 361/687–690, 361/700–704, 707–710, 697; 165/80.3, 80.4, 165/185, 104.33; 174/15.2, 16.3; 257/706–712, 257/722, 719; 29/890.043, 890.047, 726, 29/727, 52.3, 890.032, 890.046
See application file for complete search history.

(56) References Cited

U.S. PATENT DOCUMENTS

| | | | |
|---|---|---|---|
| 6,382,307 B1 * | 5/2002 | Wang et al. | 165/80.3 |
| 6,435,266 B1 * | 8/2002 | Wu | 165/80.3 |
| 6,640,888 B1 * | 11/2003 | Horng et al. | 165/185 |
| 6,651,733 B1 * | 11/2003 | Horng et al. | 165/80.3 |
| 6,749,011 B1 * | 6/2004 | Horng et al. | 165/80.3 |
| 6,882,532 B1 * | 4/2005 | Chen et al. | 361/690 |

* cited by examiner

*Primary Examiner*—Michael Datskovskiy

(57) ABSTRACT

A heat-dissipating device with heat conductive tubes comprises a heat-dissipating unit having plurality of fins; each fin having a plurality of through holes; each through hole having a corresponding via hole near the through hole; a plurality of annular walls being arranged around each through hole; and a plurality of heat conductive tubes passing through respective through holes of the fins. In manufacturing, the plurality of heat conductive tubes and the heat-dissipating unit with press bars are positioned to a fixture; a shaping mold serves to punch the press bars so that the press bar to press the side walls and thus the fins are tightly riveted to the heat conductive tubes.

3 Claims, 13 Drawing Sheets

HEAT-DISSIPATING DEVICE WITH HEAT CONDUCTIVE TUBES

FIELD OF THE INVENTION

The present invention relates to heat-dissipating device, and particular to a heat-dissipating device with heat conductive tubes, wherein a preferred punching way is used to form the heat-dissipating device so that the heat conductive tubes and heat-dissipating unit are combined tightly with an effective process.

BACKGROUND OF THE INVENTION

Two ways for dissipating heat from central processing units, or electronic elements. In one method, a plurality of fins and a fan are used to dissipating heats. In another method, a plurality of heat conductive tubes are used to guide heat from the electronic elements. The heat conductive tubes are connected to a heat-dissipating unit. However, this way is not suitable to be installed with a fan since the space is confined. Thereby, solder material is coated upon the connection of the heat conductive tubes and heat-dissipating unit. In manufacturing, they are placed in a vacuum furnace so that the solder material is permeated into the heat conductive tubes and heat-dissipating device. However, the whole manufacturing process is complicated and thus cost is high. Moreover, the solder material is harmful to human body and environments.

With reference to FIG. 1, the heat conductive tubes and heat-dissipating device are connected by tightening engagement. Each fin 10 has an axial hole 12 with a configuration corresponding to that of the heat conductive tube 11. The heat conductive tube 11 is positioned to a fixture (not shown). The shaped heat fins 10 are placed upon the heat conductive tubes 10. A shaping mold is used to punch the structure. Each fin needs one punching process so that each fin is connected to the heat conductive tube 11 tightly. However, since each time only one fin is punched, the time period is long and the process is complicated. Thereby, the vibration of the punching operation will make errors to the fins 10. Then the engagement of the heat conductive tubes 11 and fins 10 are affected so that gaps C1 generate (referring to FIG. 2). As a result yield ratio is high and then head convention from the heat conductive tube to heat-dissipating device is low. Thereby, there are many punching process being necessary in the process, and thus the shaping mold will wear and thus the lifetime is shortened.

Moreover, in the punching process, the surface of each heat conductive tubes is coated with oil. In punching, the oil will fill into the connecting surface connected the heat conductive tube due to capillary effect. This will induce the oxidization of the heat conductive tube 11 so as to reduce the heat conductivity of the heat conductive tube 11.

SUMMARY OF THE INVENTION

Accordingly, the primary object of the present invention is to provide a heat-dissipating device with heat conductive tubes which comprises a heat-dissipating unit having plurality of fins; each fin having a plurality of through holes; each through hole having a corresponding via hole near the through hole; a plurality of annular walls being arranged around each through hole; and a plurality of heat conductive tubes passing through respective through holes of the fins; a plurality of press bars; each via hole receiving a corresponding press bar; one side of each press bar being tapered; a plurality of middle walls; between the through hole and the via hole being arranged a respective middle wall. In manufacturing, the plurality of heat conductive tubes and the heat-dissipating unit with press bars are positioned to a fixture. A shaping mold serves to punch the press bars so that the press bar to press the side walls so that the fins are tightly riveted to the heat conductive tubes.

Another object of the present invention is to provide a heat-dissipating device with heat conductive tubes comprises a heat-dissipating unit having plurality of fins; each fin having a plurality of through holes; each through hole having a corresponding via hole near the through hole; a plurality of annular walls being arranged around each through hole; and a plurality of heat conductive tubes passing through respective through holes of the fins; a plurality of annular walls being positioned around the through hole; a plurality of slots; each slot being formed between each pair of the through hole and the via hole; and a plurality of press bars; each via hole receiving a corresponding press bar; one side of each press bar being tapered. In manufacturing, a shaping mold serves to punch the press bars so that the press bars punch the annular wall to deform; the deformation of the annular wall cause the through hole to reduce inwards; thereby, the fins are tightly riveted to the heat conductive tube.

A further object of the present invention is to provide a heat-dissipating device with heat conductive tubes comprises a heat-dissipating unit having plurality of fins; each fin having a plurality of through holes; each through hole having a corresponding via hole near the through hole; a plurality of annular walls being arranged around each through hole; and a plurality of heat conductive tubes passing through respective through holes of the fins; a plurality of annular walls being positioned around the through hole. Each via hole is communicated to the respective edges of the fins. In manufacturing; the heat-dissipating unit with heat conductive tubes are placed on a fixture; a shaping mold passes through the via holes to punch the middle wall so that the middle wall deforms; thereby, the fins are tightly riveted to the heat conductive tubes.

A further object of the present invention is to provide a heat-dissipating device with heat conductive tubes comprises a heat-dissipating unit having plurality of fins; each fin having a plurality of through holes; each through hole having a corresponding via hole near the through hole; a plurality of annular walls being arranged around each through hole; and a plurality of heat conductive tubes passing through respective through holes of the fins; a plurality of annular walls being positioned around the through hole; each through hole having a corresponding slot between the through hole and the via hole; each via hole being communicated to the edge of the respective fin. The heat conductive tubes are inserted into the through holes of the heat-dissipating unit; then the structure is positioned to a fixture. A shaping mold passes through the via holes to punch the middle walls so that the middle walls deform to make the fins are tightly riveted to the heat-dissipating unit.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims.

Figure 2:
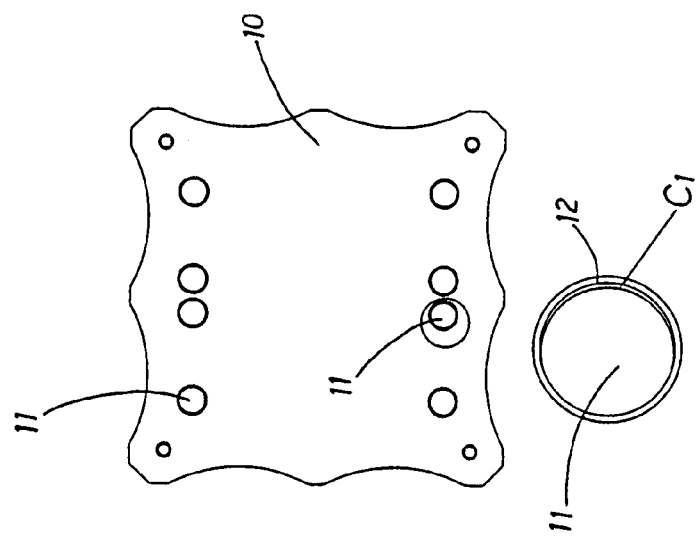
FIG. 2 is an elevational view about the operation in FIG. 1.
Figure 1:
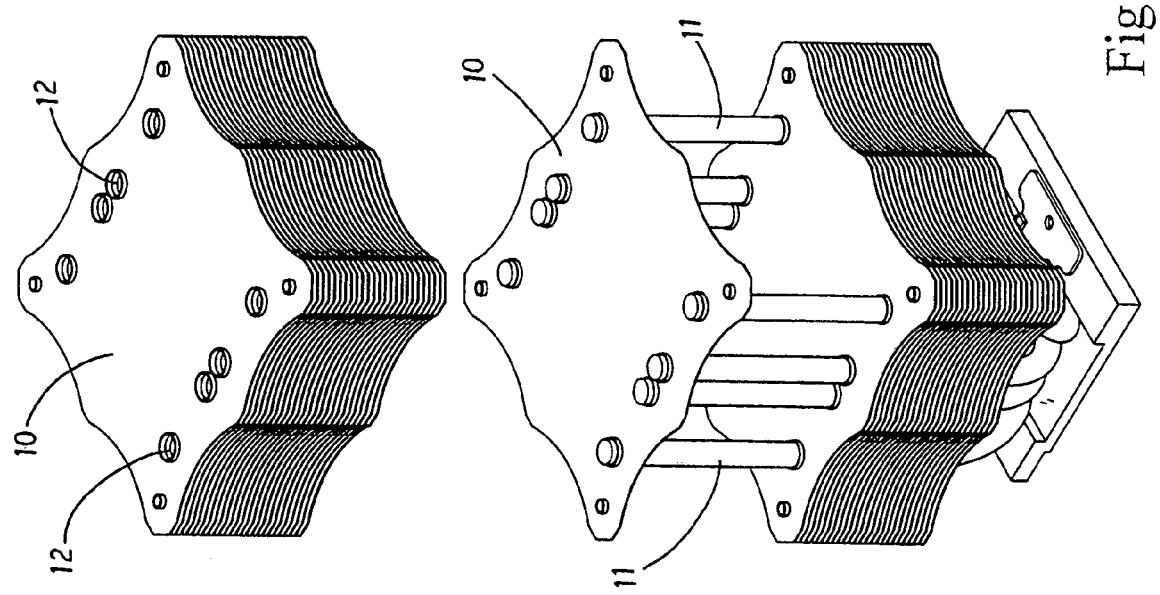
FIG. 1 is a schematic view about shaping heat conductive tubes to the heat-dissipating device according to the present invention.
Figure 3:
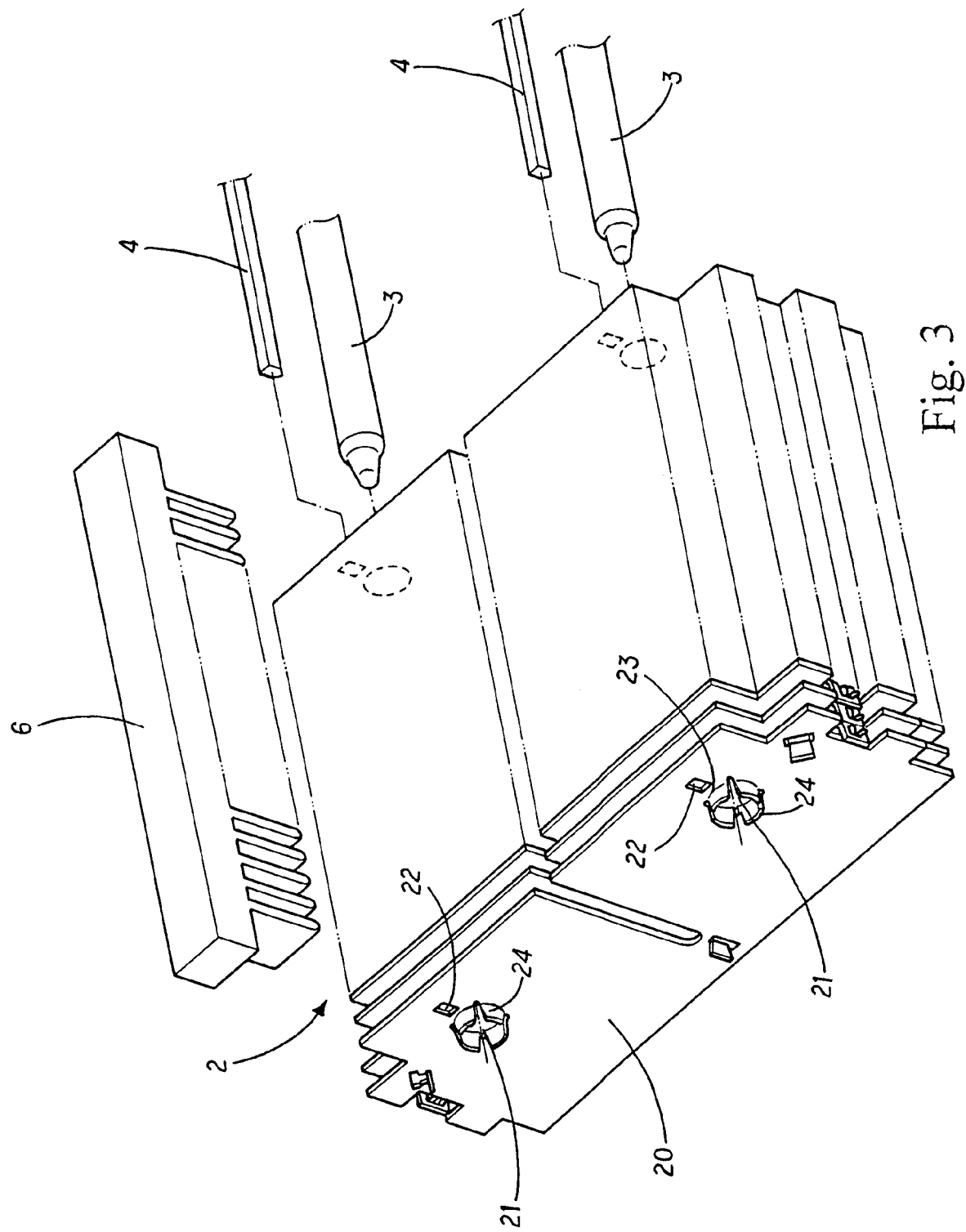
FIG. 3 is an exploded perspective view of the present invention.
Figure 4:
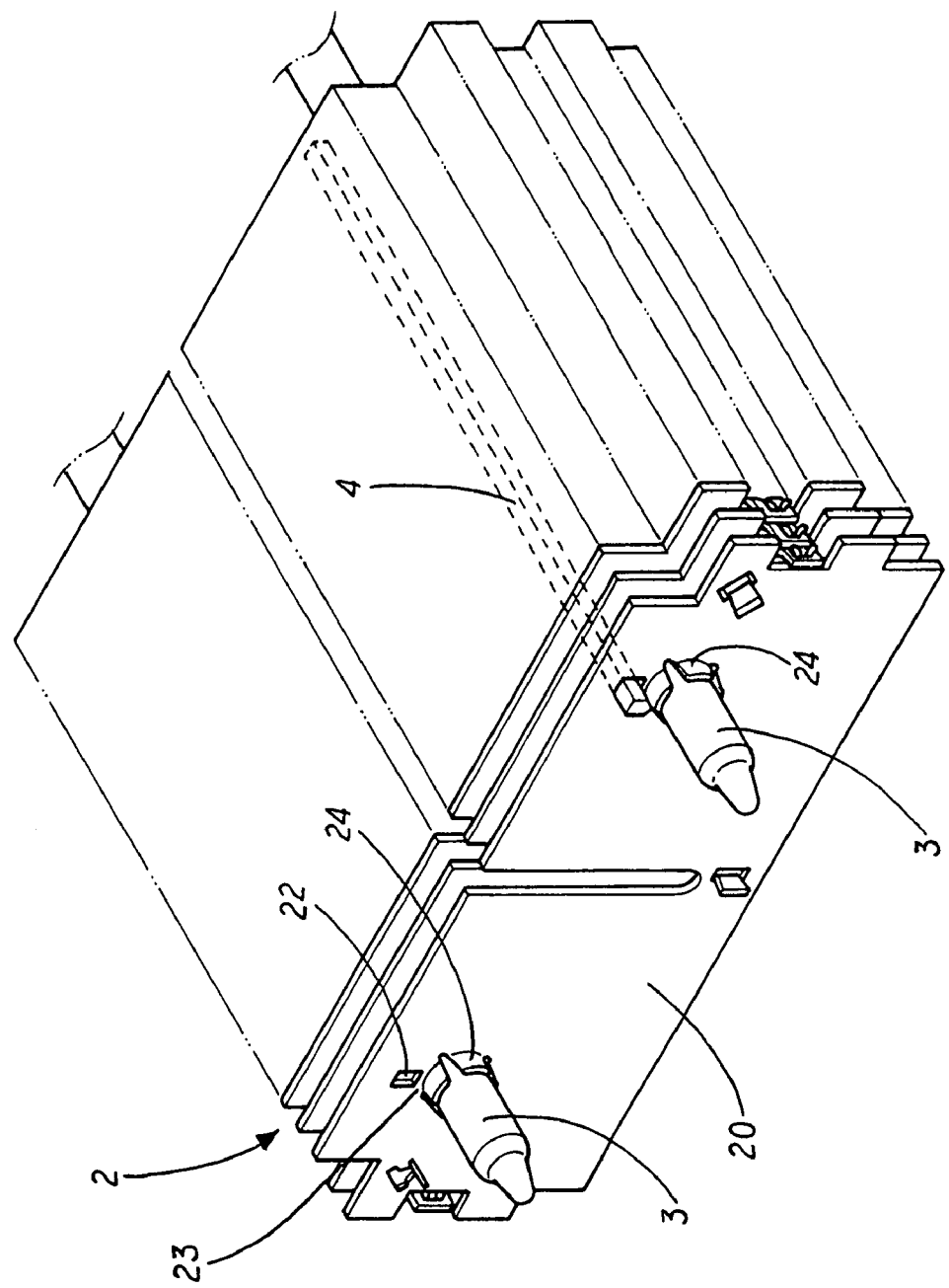
FIG. 4 is a schematic view of the present invention, where the heat conductive tubes and press bars are engaged to the fins.
Figure 5:
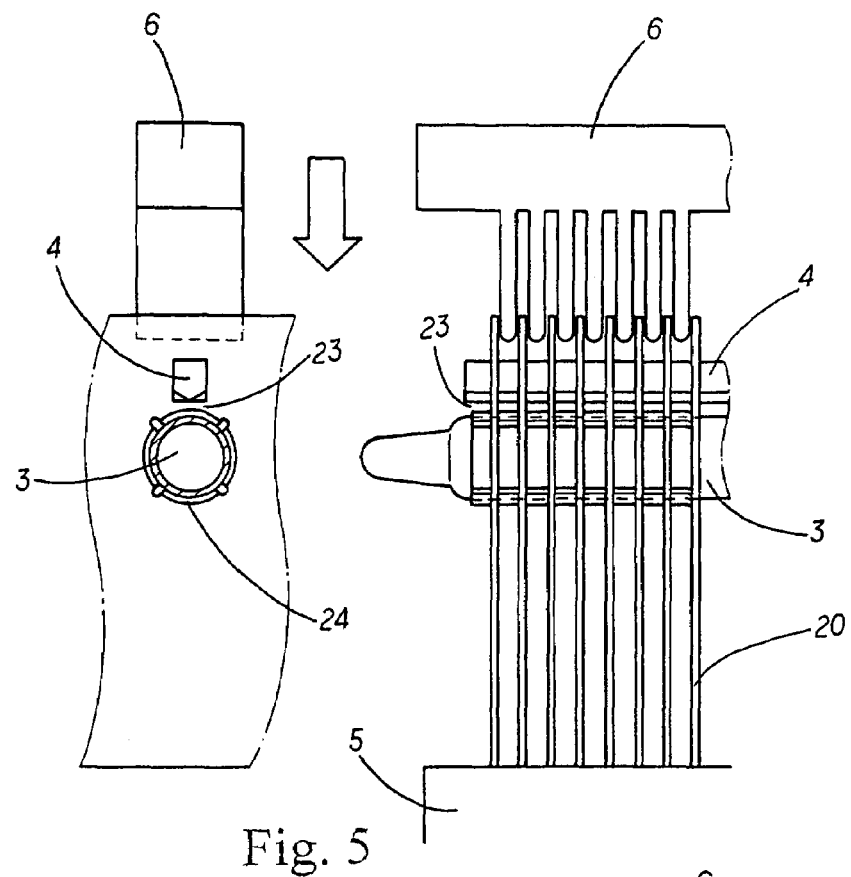
FIG. 5 is a plane view of the present invention, where the heat conductive tubes and press bars are engaged to the fins.

With reference to FIGS. 3 and 5, the structure of the present invention is illustrated. The present invention includes the following elements.

A heat-dissipating unit 2 has plurality of fins 20. In forming the heat-dissipating unit 2, the oil on the surface of each fin 20 is removed. The assembly of the fins 20 is by punching and riveting (which are known in the prior art and thus the detail will not further described here). Each fin 20 has a plurality of through holes 23. A middle wall 23a is arranged between the through hole and the via hole. A plurality of annular walls 24 are arranged at an periphery of each through hole 21. Each through hole 21 has a corresponding via hole 22 near the through hole 21.

A plurality of heat conductive tubes 3 passes through respective through holes 21 of the fins 20.

A plurality of press bars 4 pass through respective via holes 22. One side of each press bar 4 is tapered. The plurality of heat conductive tubes 3 and the heat-dissipating unit 2 with press bars 4 are positioned to a fixture 5.

Figure 6:
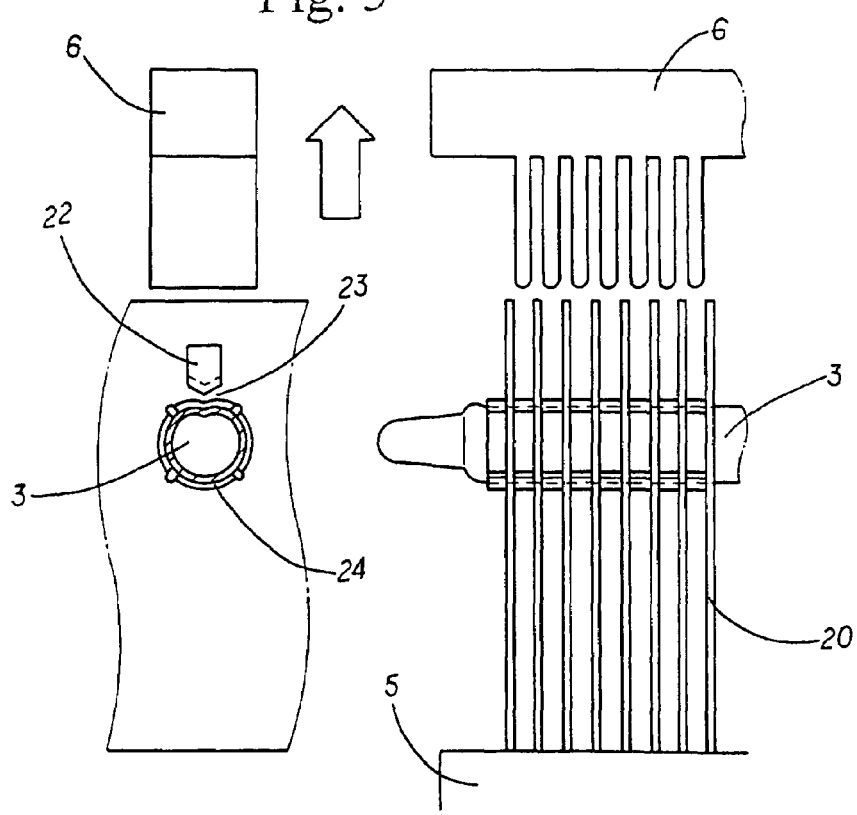
FIG. 6 is a structural schematic view of the present invention, showing the manufacturing process of the present invention.

A shaping mold 6 serves to punch the press bars 4 so that the press bar 4 to press the side walls 23 (referring to FIG. 6) so that the fins 2 are tightly riveted to the heat conductive tubes 3.

Furthermore, the annular wall 24 causes that the fins 20 are aligned in assembly process. The shaping mold 6 punches the press bars 4 so as to make the middle wall 24 deforms. Thereby, the annular wall 24 will tighten the heat conductive tube 3. Thereby, the contact areas between the heat conductive tube 3 and the fins 20 are increased so that the heat conductive effective is increased.

Figure 7:
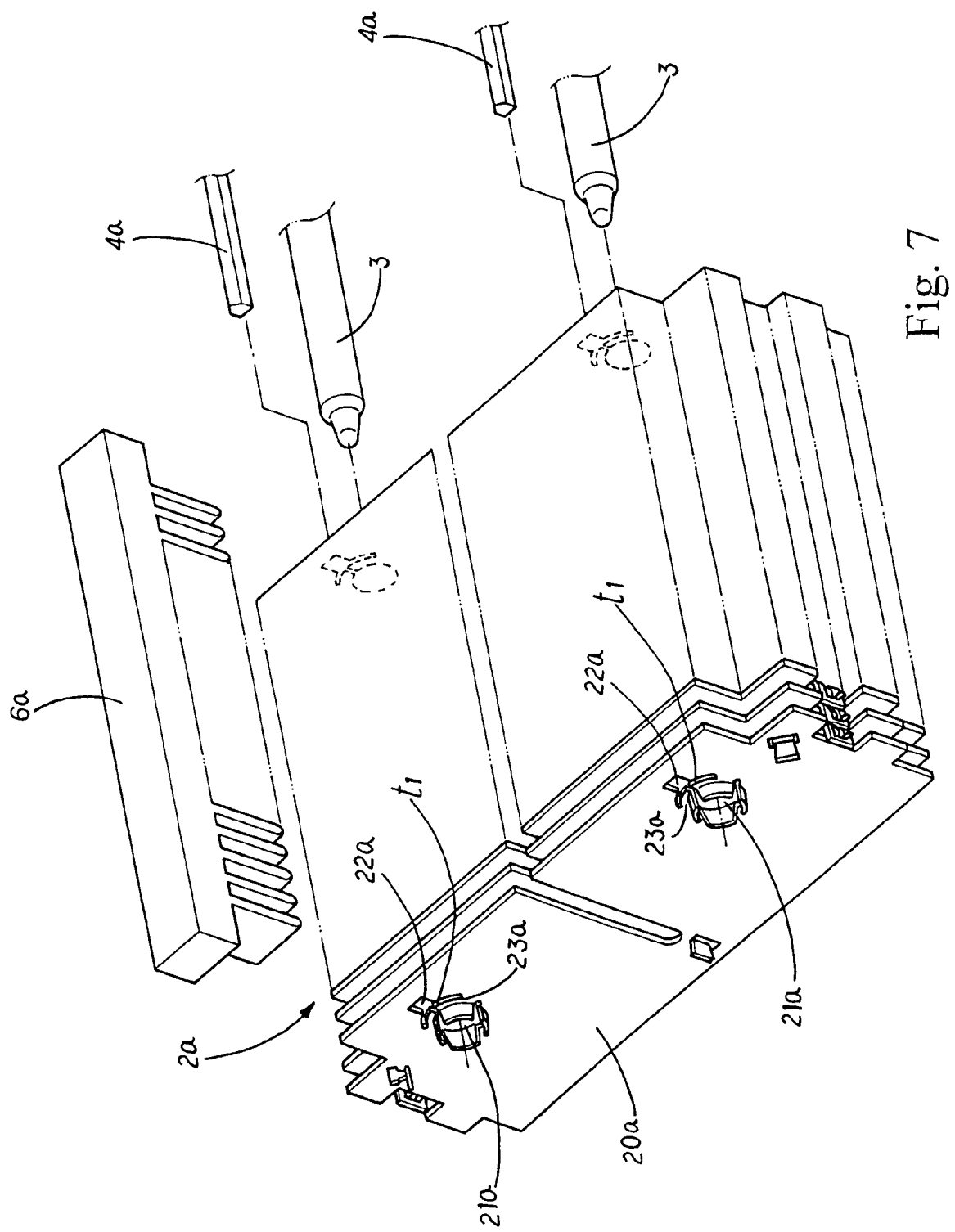
FIG. 7 is an exploded perspective view of the second embodiment of the present invention.
Figure 8:
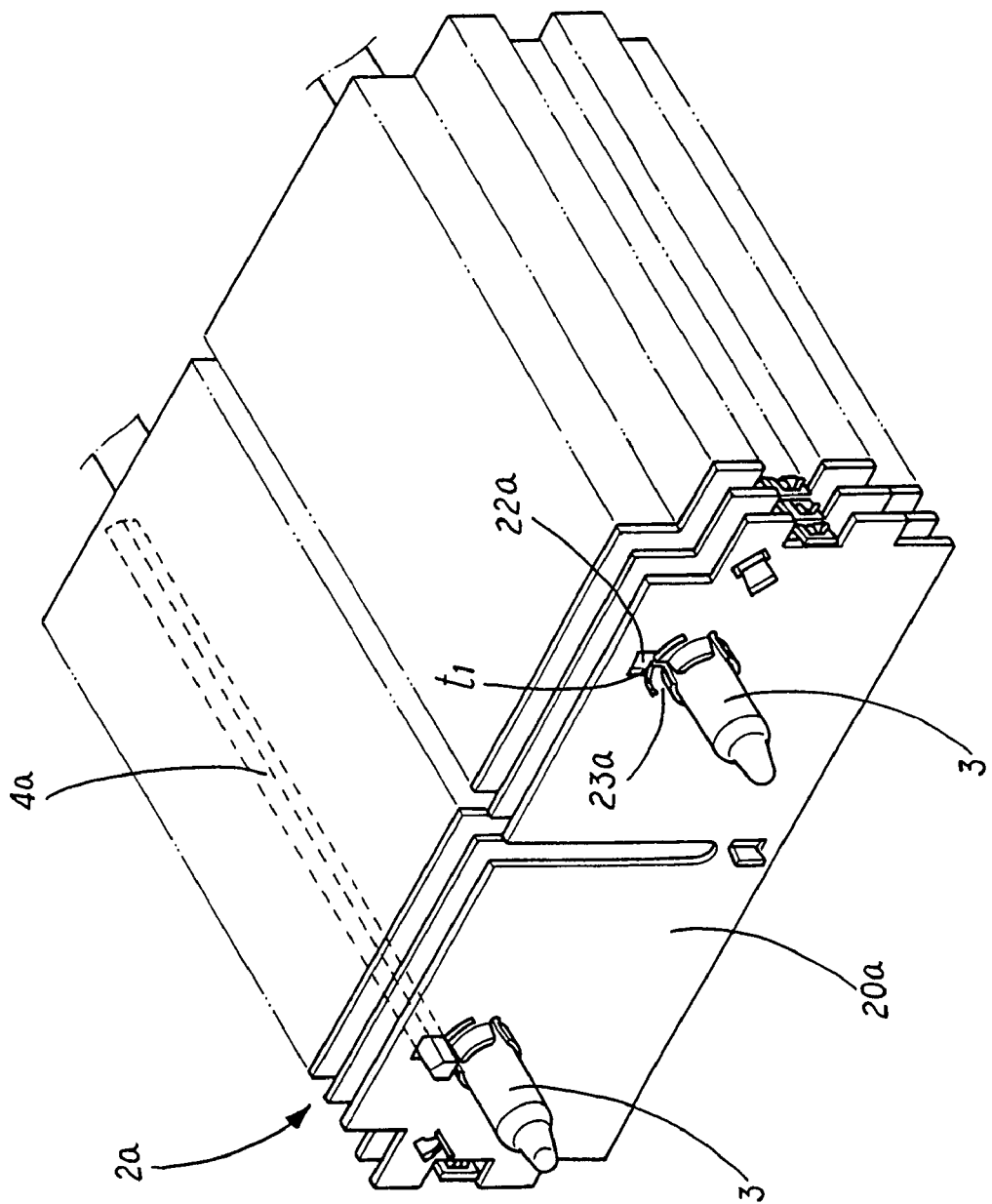
FIG. 8 is a schematic view showing the engagement of the heat conductive tubes, press bars and the fins according to the second embodiment of the present invention.
Figure 9:
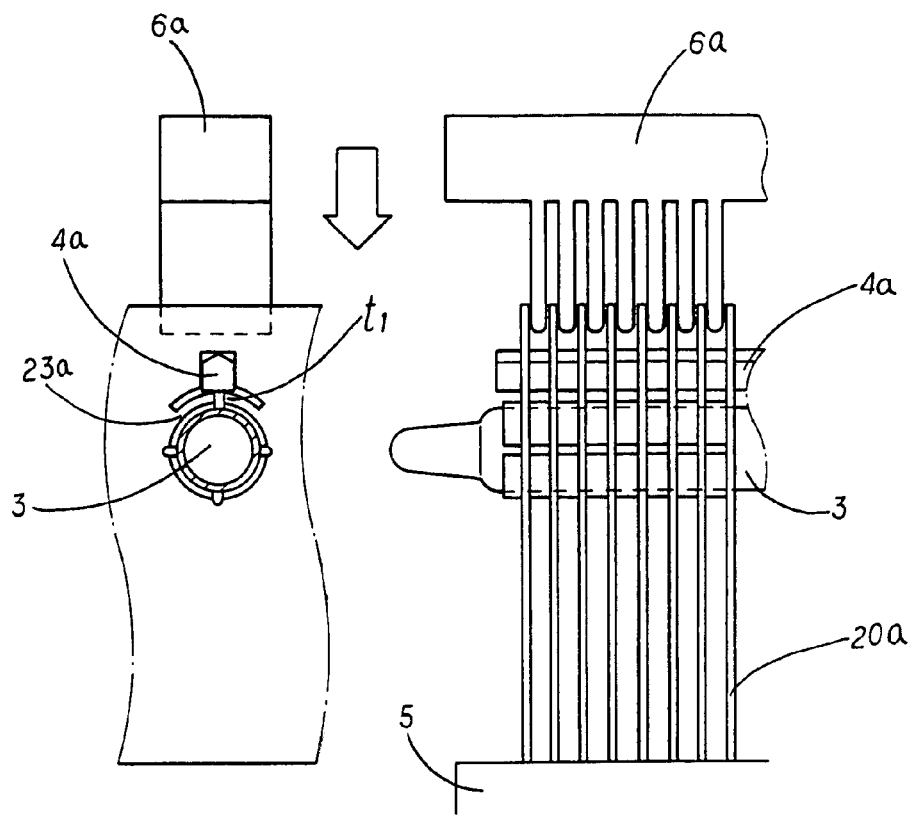
FIG. 9 is a plane view showing the engagement of the heat conductive tubes, press bars and the fins according to the second embodiment of the present invention.
Figure 10:
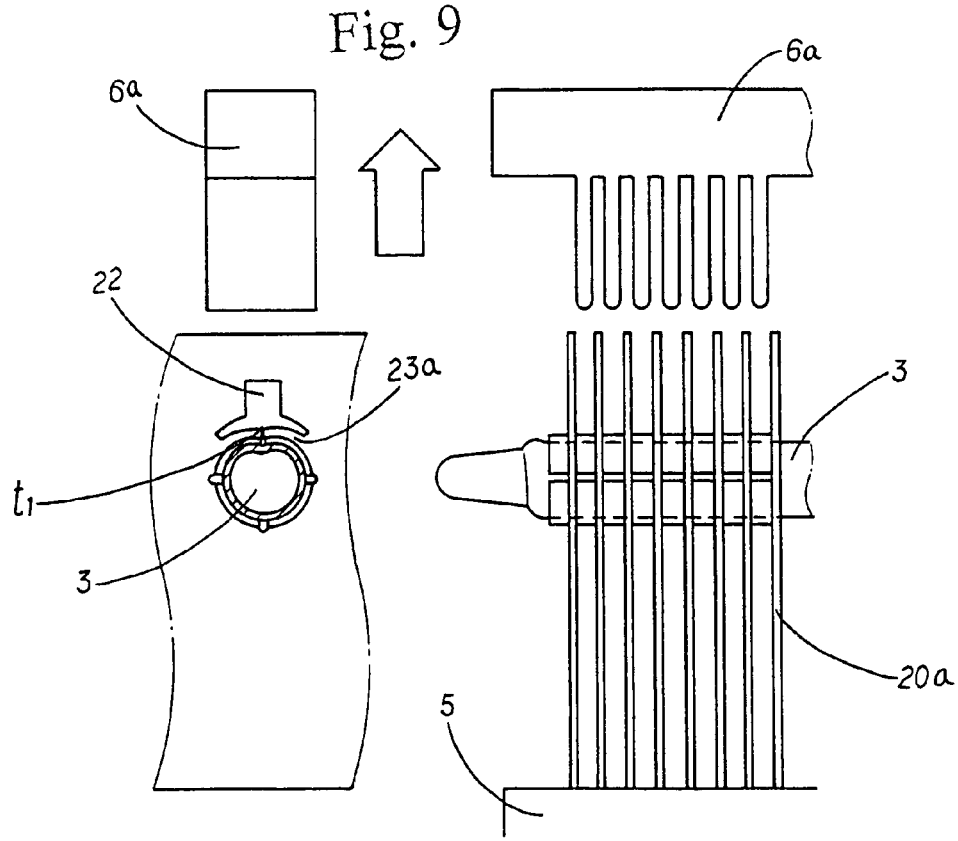
FIG. 10 is a schematic view about a second embodiment of the present invention, where a shaping mold is used to punch the heat conductive tubes.

With reference to FIGS. 7 to 9, another embodiment of the present invention is illustrated. The heat-dissipating unit 2a includes a plurality of fins 20a. A plurality of annular walls 23a are positioned around the through hole 21a. A slot t1 is formed between each pair of the through hole 21a and the via hole 22a so as to be positioned to a fixture 5. A shaping mold 6a serves to punch the press bars 4a so that the press bars 4a punch the annular wall 23a to deform. The deformation of the annular wall 23a cause the through hole 21a to reduce inwards (referring to FIG. 10). Thereby, the fins 20a are tightly riveted to the heat conductive tube 3. By above structure, the slots t1 have the effect of providing the deforming margin to the annular wall 23a. By extruding effect of the press bar 4a, the heat conductive tube 3 is preferably riveted to the fins 20a.

Figure 11:
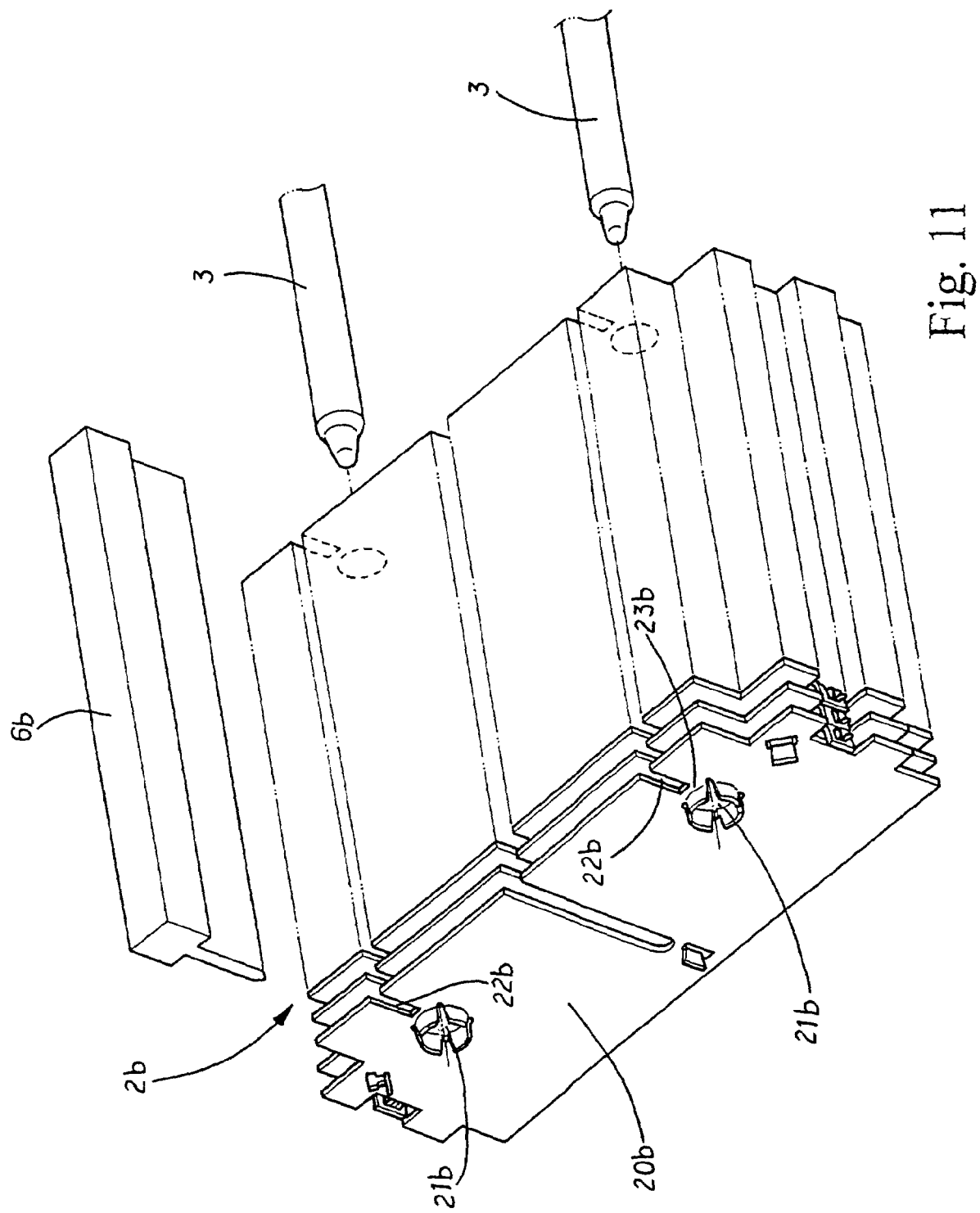
FIG. 11 is an exploded perspective view of the third embodiment of the present invention.
Figure 12:
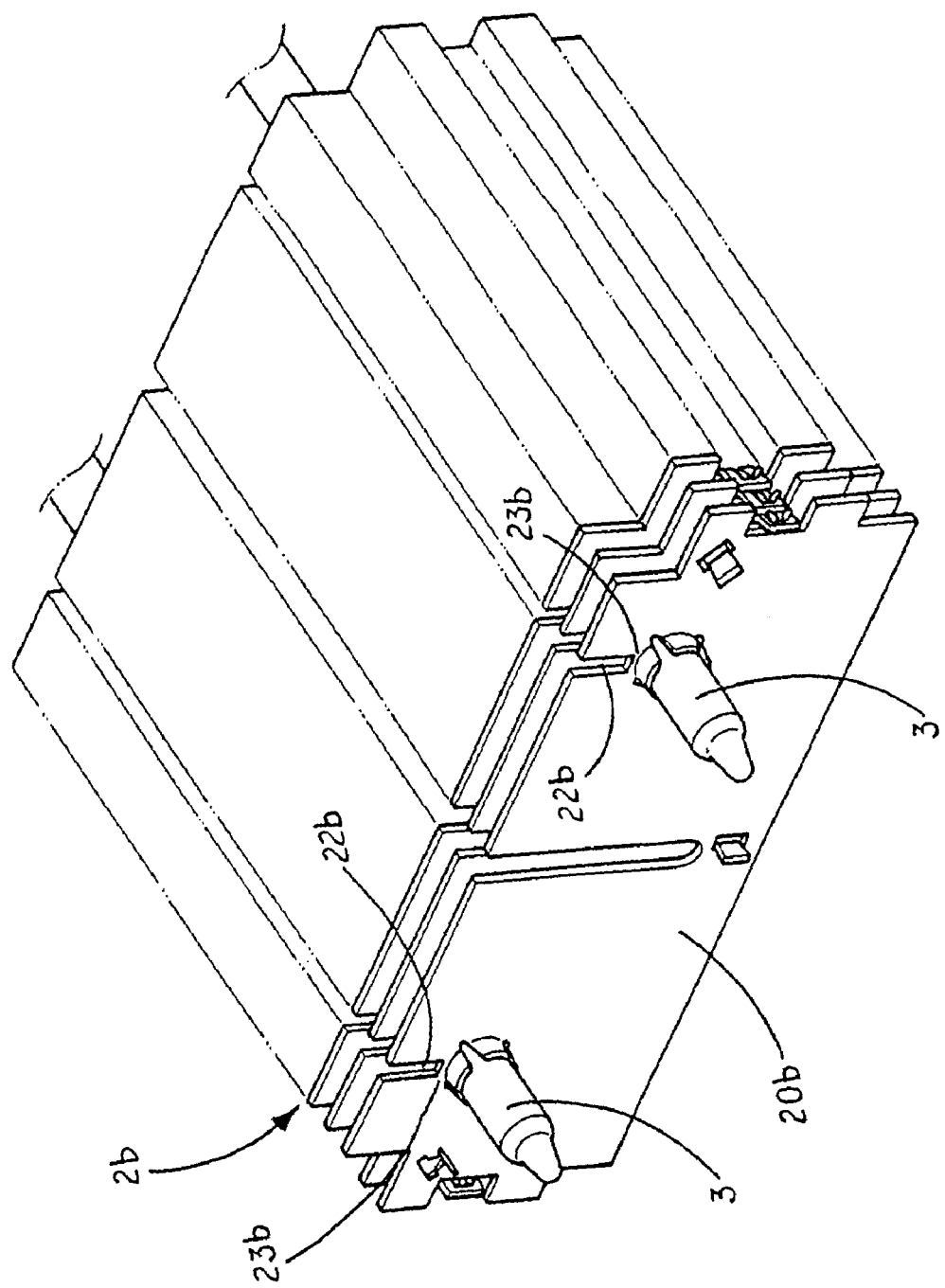
FIG. 12 is a schematic view about the third embodiment of embodiment.
Figure 13:
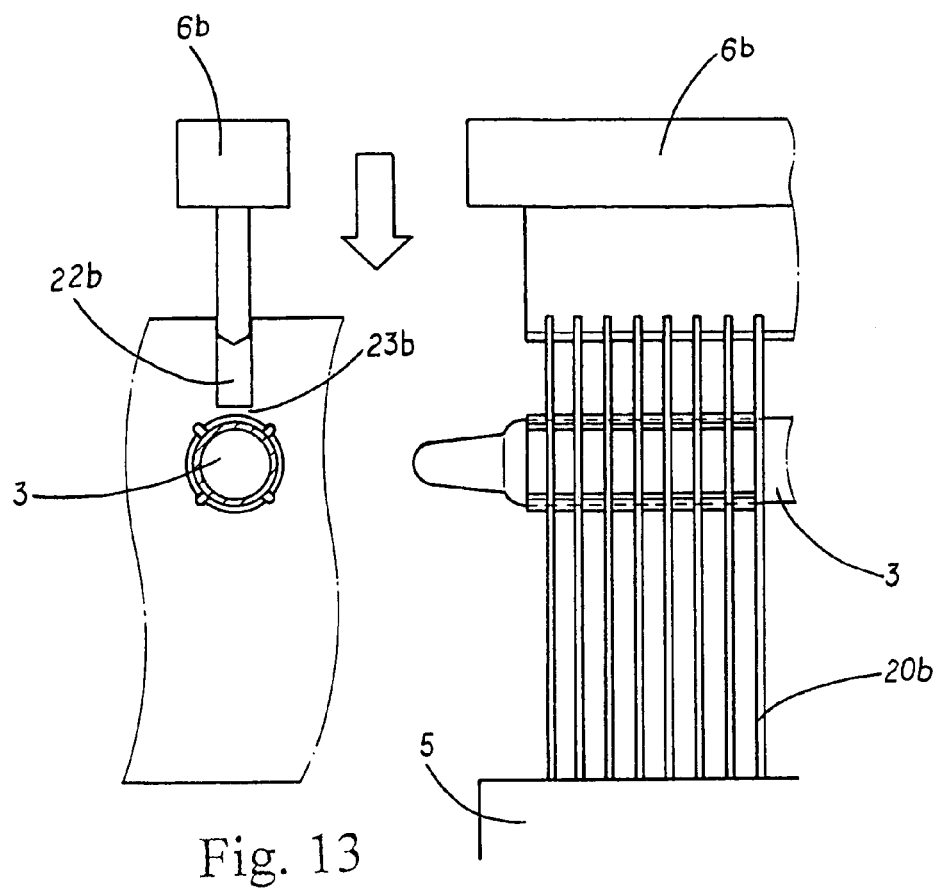
FIG. 13 is a plane view about the third embodiment of the present invention.
Figure 14:
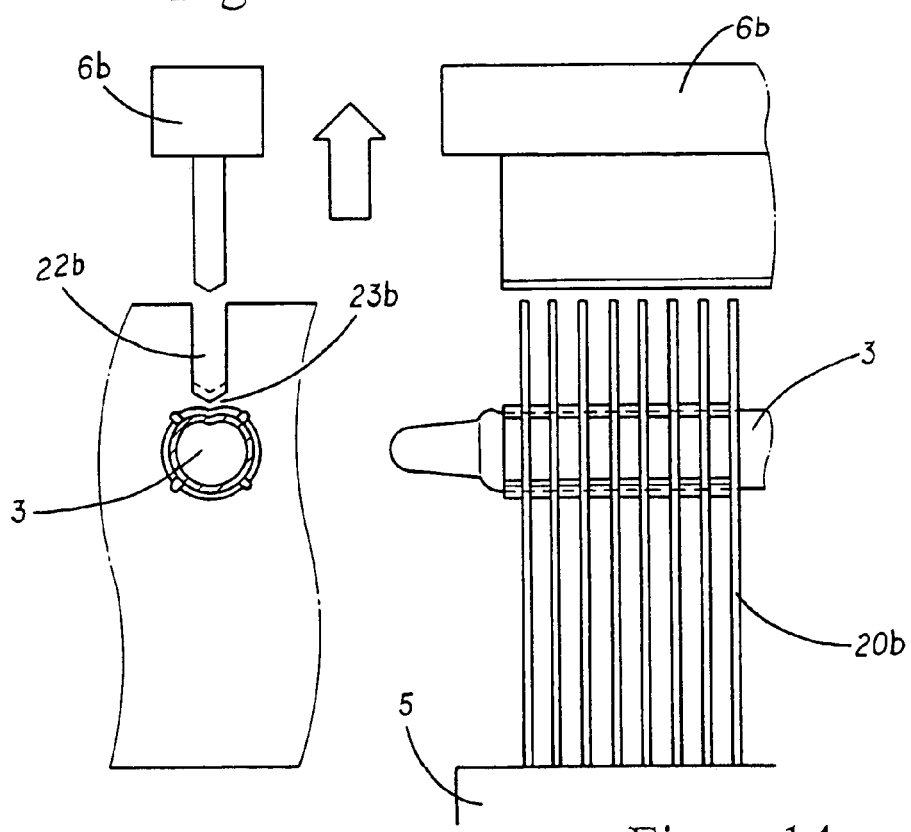
FIG. 14 is a schematic view about the fourth embodiment of the present invention.

Referring to FIGS. 11 to 13, a further embodiment of the present invention is provided. The heat-dissipating unit 2b has a plurality of fins 20b. A middle wall 23b is positioned between the through hole 21b and the via hole 22b. A plurality of via holes 22b are communicated to the respective edges of the fins 20b. The heat conductive tubes 3 are inserted into the through holes 21b. The heat-dissipating unit 2b with heat conductive tubes 3 is placed on the fixture 5. A shaping mold 6b passes through the via holes 22b to punch the middle wall 23b so that the middle wall 236 deforms (referring to FIG. 14). Thereby, the fins 20b are tightly riveted to the heat conductive tubes 3.

Figure 15:
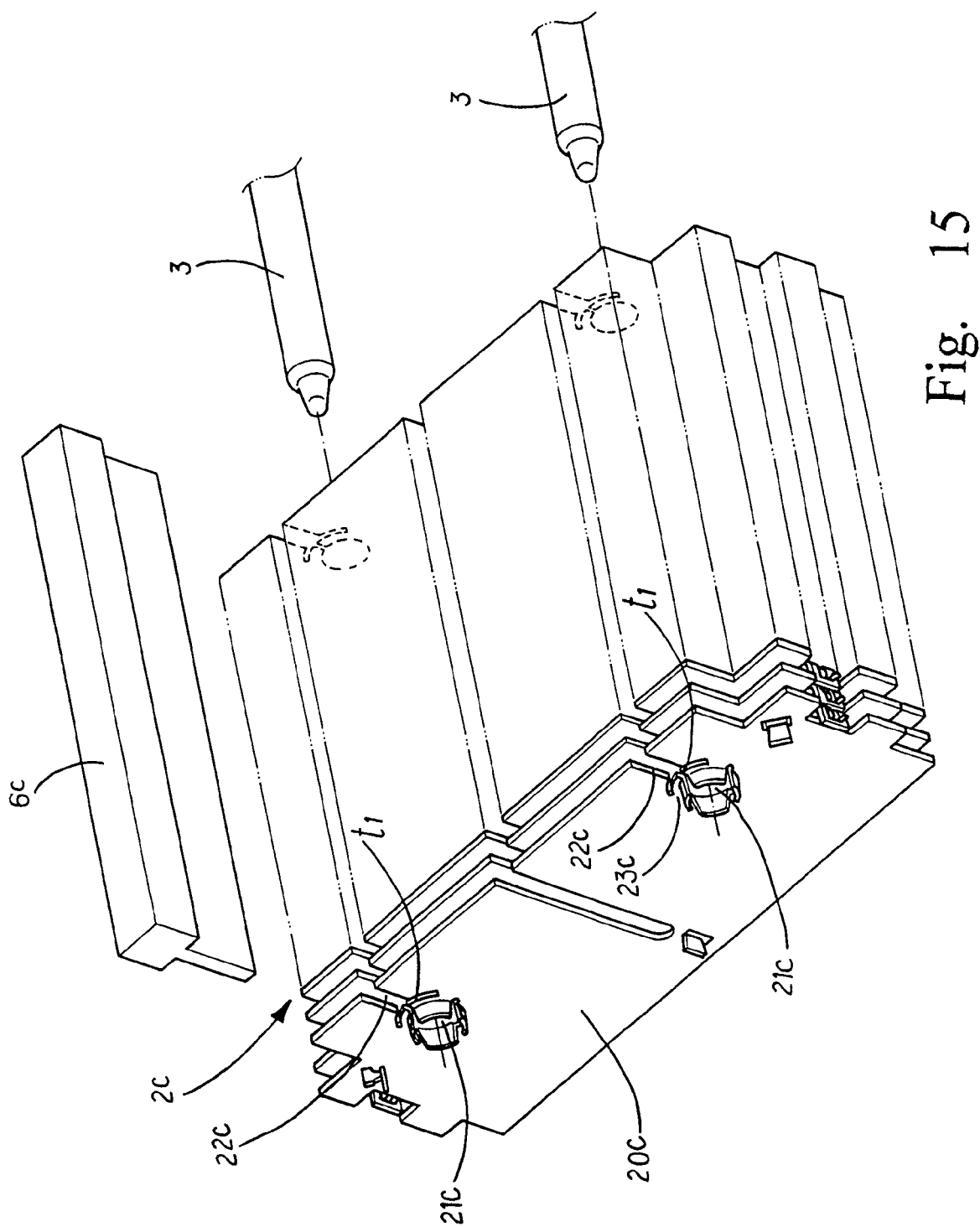
FIG. 15 is an exploded perspective view about the fourth embodiment of the present invention.
Figure 16:
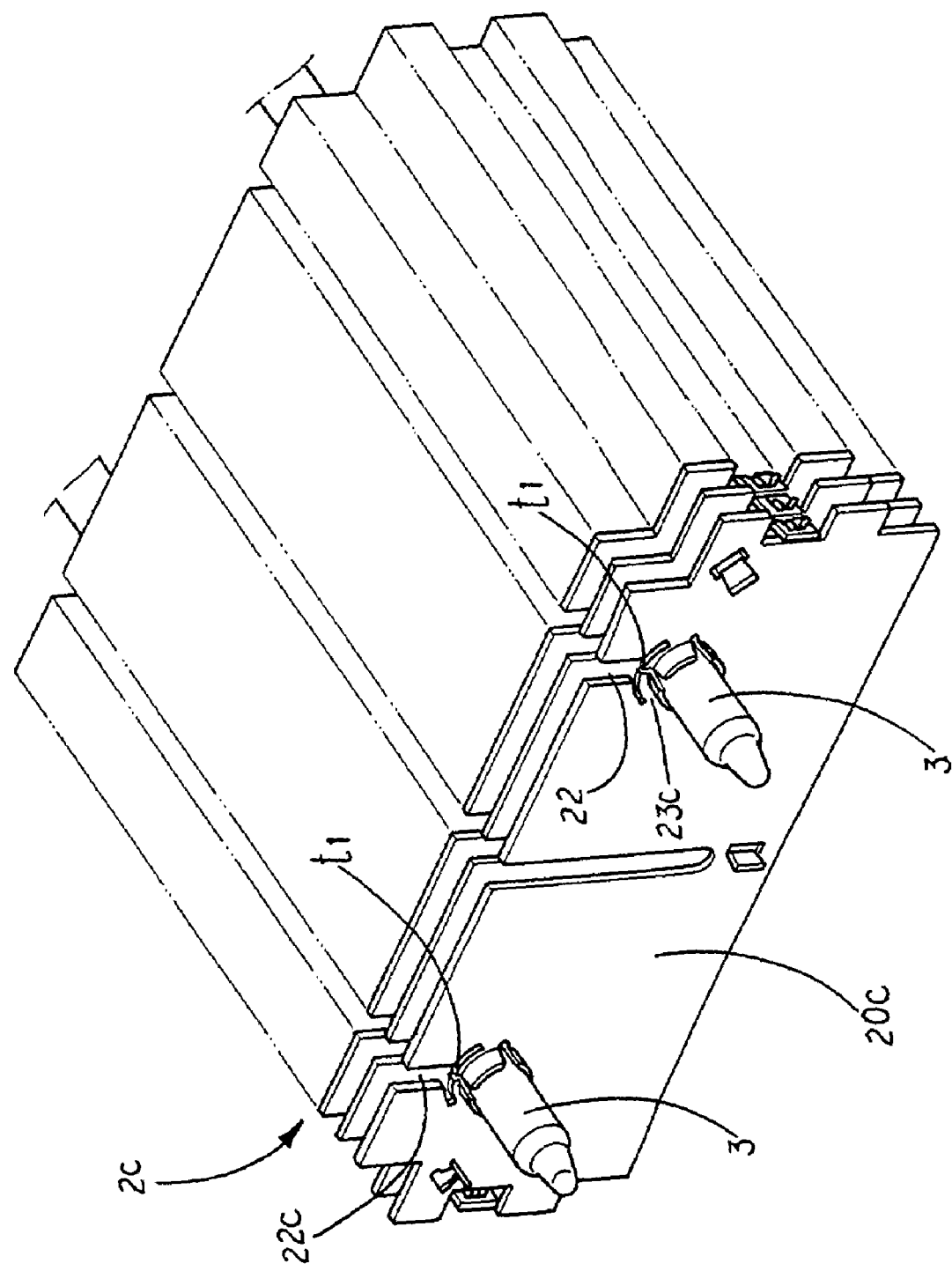
FIG. 16 is a schematic view showing the engagement of the heat conductive tubes, press bars and fins in the fourth embodiment of the present invention.
Figure 17:
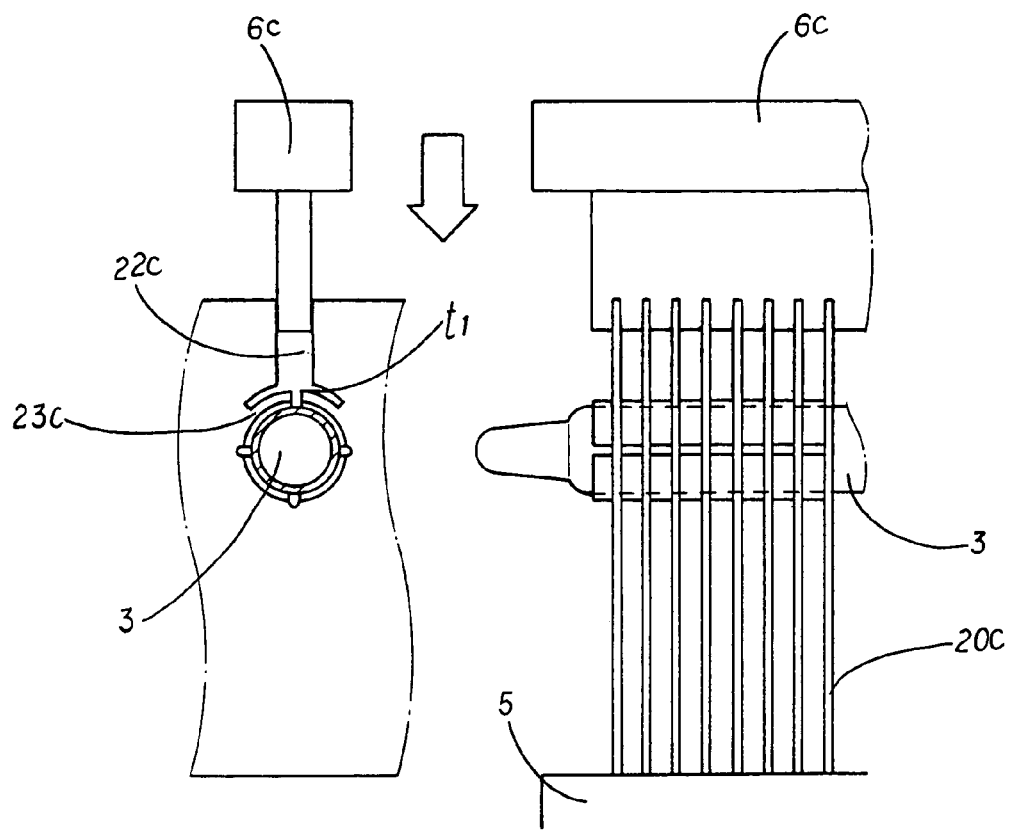
FIG. 17 is a plane view of the fourth embodiment of the present invention.
Figure 18:
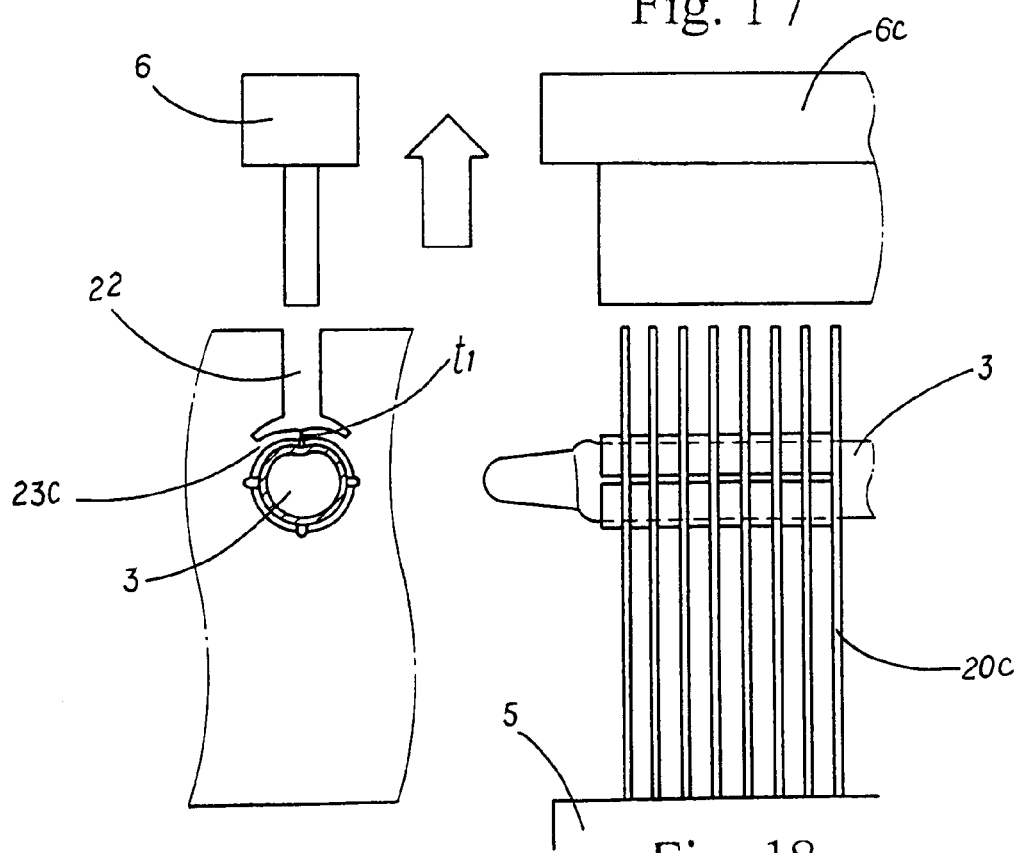
FIG. 18 is a structural schematic view about the fourth embodiment of the present invention.

Referring to FIGS. 15 to 17, another embodiment of the present invention is illustrated. The heat-dissipating unit 2c has a plurality of fins 20c. Each through hole 21c has a corresponding slot t1 between the through hole 21c and the via hole 22c. A plurality of annular walls 23c are positioned around the through hole. Each via hole 22 is communicated to the edge of the respective fin 20c. The heat conductive tubes 3 are inserted into the through holes 21c of the heat-dissipating unit 2c. Then the structure is positioned to the fixture 5. A shaping mold 6c passes through the via holes 22c to punch the middle walls 23c so that the middle walls 23c deform to make the fins 20c are tightly riveted to the heat-dissipating unit 3c.

Thus, by above mentioned method, by the fins 20b, 20c, via holes 22b, 22c, and shaping molds 6b, 6c can punch the middle walls 23b, 23c so that the middle walls 23b, 23c deform. Thereby, no press bar is required.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A heat-dissipating device with heat conductive tubes comprising:
- a heat-dissipating unit having plurality of fins; each fin having a plurality of through holes; each through hole having a corresponding via hole near the through hole;
- a plurality of annular walls; each through hole being enclosed by a predetermined number of the annular walls; and
- a plurality of heat conductive tubes passing through respective through holes of the fins;
- a plurality of press bars; each via hole receiving a corresponding press bar; one side of each press bar being tapered;
- a plurality of middle walls; between the through hole and the via hole being arranged a respective middle wall; and
- wherein in manufacturing, the plurality of heat conductive tubes and the heat-dissipating unit with press bars are positioned to a fixture; a shaping mold serves to punch the press bars so that the press bar to press the side walls and thus the fins are tightly riveted to the heat conductive tubes.

2. A heat-dissipating device with heat conductive tubes comprising:
- a heat-dissipating unit having plurality of fins; each fin having a plurality of through holes; each through hole having a corresponding via hole near the through hole;
- a plurality of annular walls; each through hole being enclosed by a predetermined number of the annular walls; and
- a plurality of heat conductive tubes passing through respective through holes of the fins;
- a plurality of annular walls being positioned around the through hole;
- wherein each via hole is communicated to the respective edges of the fins; and
- wherein in manufacturing; the heat-dissipating unit with heat conductive tubes are placed on a fixture; a shaping mold passes through the via holes to punch the middle wall so that the middle wall deforms; thereby, the fins are tightly riveted to the heat conductive tubes.

3. A heat-dissipating device with heat conductive tubes comprising:
- a heat-dissipating unit having plurality of fins; each fin having a plurality of through holes; each through hole having a corresponding via hole near the through hole;
- a plurality of annular walls; each through hole being enclosed by a predetermined number of the annular walls; and
- a plurality of heat conductive tubes passing through respective through holes of the fins;
- a plurality of annular walls being positioned around the through hole;
- each through hole having a corresponding slot between the through hole and the via hole; each via hale being communicated to the edge of the respective fin;
- wherein the heat conductive tubes are inserted into the through holes of the heat-dissipating unit; then the structure is positioned to a fixture; a shaping mold passes through the via holes to punch the middle walls so that the middle walls deform to make the fins are tightly riveted to the heat-dissipating unit.

* * * * *